United States Patent [19]
Toyoyama

[11] Patent Number: 6,140,944
[45] Date of Patent: Oct. 31, 2000

[54] VARIABLE-LENGTH CODING DEVICE AND METHOD USING TABLE THAT HOLDS INFORMATION ON PRESENCE/ABSENCE OF CODE CORRESPONDINGLY TO REGION REPRESENTED BY COMBINATION OF RUN DATA AND LEVEL DATA

[75] Inventor: Shinji Toyoyama, Sakurai, Japan

[73] Assignee: Sharp Kabushiki Kaisha, Osaka, Japan

[21] Appl. No.: 09/081,516

[22] Filed: May 20, 1998

[30] Foreign Application Priority Data

May 21, 1997 [JP] Japan .................................. 9-131019

[51] Int. Cl.[7] ...................................... H03M 7/46
[52] U.S. Cl. ................................. 341/63; 341/67
[58] Field of Search ................................ 341/63, 67, 101

[56] References Cited

U.S. PATENT DOCUMENTS

| 5,381,144 | 1/1995 | Wilson et al. ............................. 341/63 |
| 5,394,143 | 2/1995 | Murray et al. ............................ 341/63 |
| 5,398,027 | 3/1995 | Ooi ........................................... 341/67 |
| 5,402,123 | 3/1995 | Jung ......................................... 341/63 |
| 5,539,401 | 7/1996 | Kumaki et al. . | |

FOREIGN PATENT DOCUMENTS 8-79091  3/1996  Japan .

*Primary Examiner*—Howard L. Williams
*Assistant Examiner*—Jean B. Jeanglaude

[57] ABSTRACT

A variable-length coding device includes: a code presence/absence determination table storing information concerning whether a code is allocated or not correspondingly to a prescribed region in a region represented by a combination of run data and level data; a first region determination circuit and a second region determination circuit determining whether a pair of run data and level data is contained in the prescribed region; and a run.level pair conversion circuit, a first code table, and a second code table that perform coding, referring to the code presence/absence determination table, if the first region determination circuit and the second region determination circuit determine that the pair of run data and level data is contained in the prescribed region, and that perform coding without referring to the code presence/absence determination table if the first region determination circuit and the second region determination circuit determine that the pair of run data and level data is not contained in the prescribed region.

9 Claims, 7 Drawing Sheets

|  | \ | LEVEL DATA | | | | | | | | | | | | | | | | | | | | | | | | |
|---|---|---|---|---|---|---|---|---|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | . | 255 |
| RUN DATA | 0 | 11 | 3 | 4 | 5 | 5 | 6 | 6 | 7 | 7 | 8 | 8 | 8 | 9 | 9 | 9 | 9 | 9 | 9 | 9 | 10 | 10 | 10 | 10 | 16 | 16 | . | 16 |
| | 1 | 11 | 5 | 6 | 8 | 8 | 9 | 9 | 10 | 11 | 11 | 12 | 12 | 13 | 13 | 13 | | | | | | | | | | | | |
| | 2 | 12 | 6 | 8 | 9 | 10 | 10 | 11 | 13 | 13 | 13 | 13 | | | | | | | | | | | | | | | | |
| | 3 | 12 | 7 | 9 | 10 | 11 | 11 | 12 | 13 | | | | | | | | | | | | | | | | | | | |
| | 4 | 12 | 7 | 9 | 10 | 12 | 13 | | | | | | | | | | | | | | | | | | | | | |
| | 5 | 12 | 8 | 10 | 11 | | | | | | | | | | | | | | | | | | | | | | | |
| | 6 | 13 | 8 | 10 | 12 | | | | | | | | | | | | | | | | | | | | | | | |
| | 7 | 13 | 9 | 13 | 13 | | | | | | | | | | | | | | | | | | | | | | | |
| | 8 | 13 | 9 | 13 | 13 | | | | | | | | | | | | | | | | | | | | | | | |
| | 9 | 13 | 9 | 13 | | | | | | | | | | | | | | | | | | | | | | | | |
| | 10 | 13 | 9 | 13 | | | | | | | | | | | | | | | | | | | | | | | | |
| | 11 | 13 | 10 | | | | | | | | | | | | | | | | | | | | | | | | | |
| | 12 | 13 | 10 | | | | | | | | | | | | | | | | | | | | | | | | | |
| | 13 | 13 | 10 | | | | | | | | | | | | | | | | | | | | | | | | | |
| | 14 | 13 | 10 | | | | | | | | | | | | | | | | | | | | | | | | | |
| | 15 | 13 | | | | | | | | | | | | | | | | | | | | | | | | | | |
| | 16 | 13 | | | | | | | | | | | | | | | | | | | | | | | | | | |
| | . | | | | | | | | | | | | | | | | | | | | | | | | | | | |
| | . | | | | | | | | | | | | | | | | | | | | | | | | | | | |
| | 60 | 13 | | | | | | | | | | | | | | | | | | | | | | | | | | |
| | 61 | 13 | | | | | | | | | | | | | | | | | | | | | | | | | | |

|  | LEVEL DATA | | | | | | | | | | | | | | | | | | | | | | | | |
|---|---|---|---|---|---|---|---|---|---|---|---|---|---|---|---|---|---|---|---|---|---|---|---|---|---|
| RUN DATA | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | . . 255 |
| 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | . . 1 |
| 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | . . 0 |
| 2 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | . . 0 |
| 3 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | . . 0 |
| 4 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | . . 0 |
| 5 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | . . 0 |
| 6 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | . . 0 |
| 7 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 8 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 9 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 10 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 11 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 12 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 13 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 14 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 15 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 16 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| . | . | . | . | . | . | . | . | . | . | . | . | . | . | . | . | . | . | . | . | . | . | . | . | . | . . . |
| . | . | . | . | . | . | . | . | . | . | . | . | . | . | . | . | . | . | . | . | . | . | . | . | . | . . . |
| 60 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |
| 61 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | . . 0 |

LEVEL DATA

RUN DATA

|   | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|----|----|----|----|----|----|----|----|
| 1 | 1 | 1 | 1 | 1 | 1 | 1 | 1 | 1 | 1 | 1  | 1  | 1  | 1  | 1  | 1  | 1  | 1  |
| 2 | 1 | 1 | 1 | 1 | 1 | 1 | 1 | 1 | 1 | 1  | 0  | 0  | 0  | 0  | 0  | 0  |    |
| 3 | 1 | 1 | 1 | 1 | 1 | 1 | 1 | 0 | 0 | 0  | 0  | 0  | 0  | 0  | 0  | 0  |    |
| 4 | 1 | 1 | 1 | 1 | 1 | 0 | 0 | 0 | 0 | 0  | 0  | 0  | 0  | 0  | 0  | 0  |    |
| 5 | 1 | 1 | 1 | 0 | 0 | 0 | 0 | 0 | 0 | 0  | 0  | 0  | 0  | 0  | 0  | 0  |    |
| 6 | 1 | 1 | 1 | 0 | 0 | 0 | 0 | 0 | 0 | 0  | 0  | 0  | 0  | 0  | 0  | 0  |    |
| 7 | 1 | 1 | 1 | 0 | 0 | 0 | 0 | 0 | 0 | 0  | 0  | 0  | 0  | 0  | 0  | 0  |    |
| 8 | 1 | 1 | 1 | 0 | 0 | 0 | 0 | 0 | 0 | 0  | 0  | 0  | 0  | 0  | 0  | 0  |    |
| 9 | 1 | 1 | 0 | 0 | 0 | 0 | 0 | 0 | 0 | 0  | 0  | 0  | 0  | 0  | 0  | 0  |    |
| 10 | 1 | 1 | 0 | 0 | 0 | 0 | 0 | 0 | 0 | 0 | 0  | 0  | 0  | 0  | 0  | 0  |    |
| 11 | 1 | 0 | 0 | 0 | 0 | 0 | 0 | 0 | 0 | 0 | 0  | 0  | 0  | 0  | 0  | 0  |    |
| 12 | 1 | 0 | 0 | 0 | 0 | 0 | 0 | 0 | 0 | 0 | 0  | 0  | 0  | 0  | 0  | 0  |    |
| 13 | 1 | 0 | 0 | 0 | 0 | 0 | 0 | 0 | 0 | 0 | 0  | 0  | 0  | 0  | 0  | 0  |    |
| 14 | 1 | 0 | 0 | 0 | 0 | 0 | 0 | 0 | 0 | 0 | 0  | 0  | 0  | 0  | 0  | 0  |    |

FIG. 8A

LEVEL DATA (LEVEL DATA ≠ 0)

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | · | · | 255 |
|---|---|---|---|---|---|---|---|---|----|----|----|----|----|----|----|----|----|----|----|----|----|----|----|---|---|-----|
| 3 | 4 | 5 | 5 | 6 | 6 | 7 | 7 | 8 | 8  | 8  | 9  | 9  | 9  | 9  | 9  | 9  | 10 | 10 | 10 | 10 | 10 | 16 | 16 | · | · | 16  |

FIG. 8B

RUN DATA (LEVEL DATA = 0)

| 0 | 1 | 2 | 3 | 4 | 5 | 6 | 7 | 8 | 9 | 10 | 11 | 12 | 13 | 14 | 15 | 16 | · | · | 60 | 61 |
|---|---|---|---|---|---|---|---|---|---|----|----|----|----|----|----|----|---|---|----|----|
| 11 | 11 | 12 | 12 | 12 | 12 | 13 | 13 | 13 | 13 | 13 | 13 | 13 | 13 | 13 | 13 | 13 | · | · | 13 | 13 |

FIG. 9

LEVEL DATA

|   | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|----|----|----|----|----|----|----|----|
| 1 | 5 | 6 | 8 | 8 | 9 | 9 | 9 | 10 | 11 | 11 | 11 | 12 | 12 | 12 | 13 | 13 | 13 |
| 2 | 6 | 8 | 9 | 10 | 10 | 11 | 13 | 13 | 13 | 13 | 13 | | | | | | |
| 3 | 7 | 9 | 10 | 11 | 11 | 12 | 13 | | | | | | | | | | |
| 4 | 7 | 9 | 10 | 12 | 13 | | | | | | | | | | | | |
| 5 | 8 | 10 | 11 | | | | | | | | | | | | | | |
| 6 | 8 | 10 | 12 | | | | | | | | | | | | | | |
| 7 | 9 | 13 | 13 | | | | | | | | | | | | | | |
| 8 | 9 | 13 | 13 | | | | | | | | | | | | | | |
| 9 | 9 | 13 | | | | | | | | | | | | | | | |
| 10 | 9 | 13 | | | | | | | | | | | | | | | |
| 11 | 10 | | | | | | | | | | | | | | | | |
| 12 | 10 | | | | | | | | | | | | | | | | |
| 13 | 10 | | | | | | | | | | | | | | | | |
| 14 | 10 | | | | | | | | | | | | | | | | |

RUN DATA (row labels)

VARIABLE-LENGTH CODING DEVICE AND METHOD USING TABLE THAT HOLDS INFORMATION ON PRESENCE/ABSENCE OF CODE CORRESPONDINGLY TO REGION REPRESENTED BY COMBINATION OF RUN DATA AND LEVEL DATA

BACKGROUND OF THE INVENTION

1. Field of the Invention

The present invention relates to a variable-length coding device and a method thereof used for a coding device for image data. In particular, the invention relates to a variable-length coding device and a method thereof achieving reduction of power consumption by decreasing a capacity of a memory used as a table and frequency of access to the memory.

2. Description of the Background Art

A great amount of data generally contained in an image signal is compressed for transmission and recording, and the compressed data is expanded when the data is received or reproduced. One method of compressing image data is the variable-length coding system. According to this system, when an input coefficient string is to be coded, a code of a short length is assigned to a pattern of a coefficient string with a high probability of occurrence, and a code of a long length is assigned to a pattern of a coefficient string with a low probability of occurrence, thereby decreasing an average code length.

Figure 1:
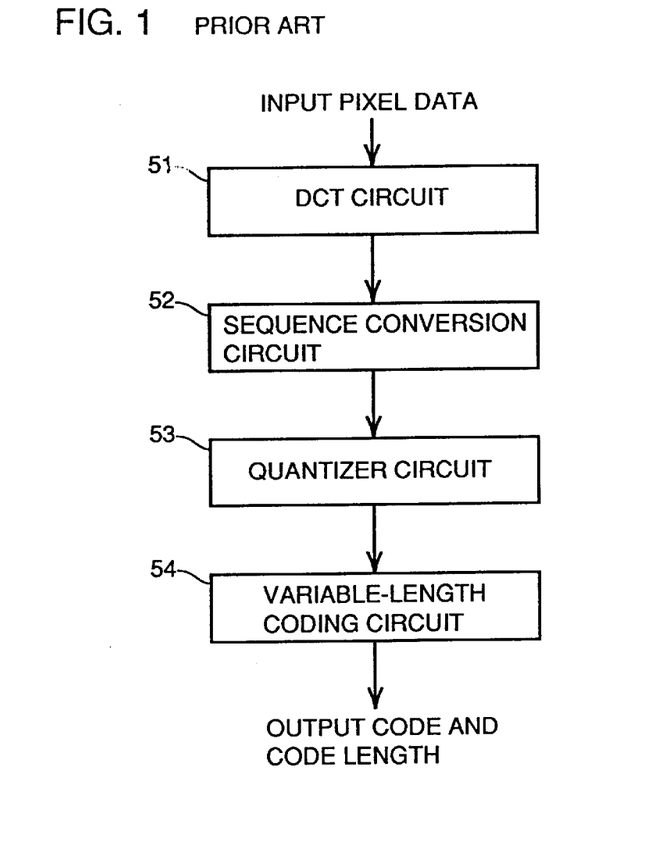
FIG. 1 shows a conventional and general structure of a coding device.

FIG. 1 shows a general structure of a coding device including a conventional variable-length coding circuit. An input image is divided into 8×8-pixel data, and converted to 8×8 coefficients representing frequency components by a discrete cosine transformation (DCT) circuit 51. The order of these coefficients is changed such that they are arranged from coefficients of lower frequency components by a sequence conversion circuit 52, and resultant coefficients are quantized by a quantizer circuit 53. The coefficients are finally coded to a variable-length code to be output by a variable-length coding circuit 54.

Figure 2:
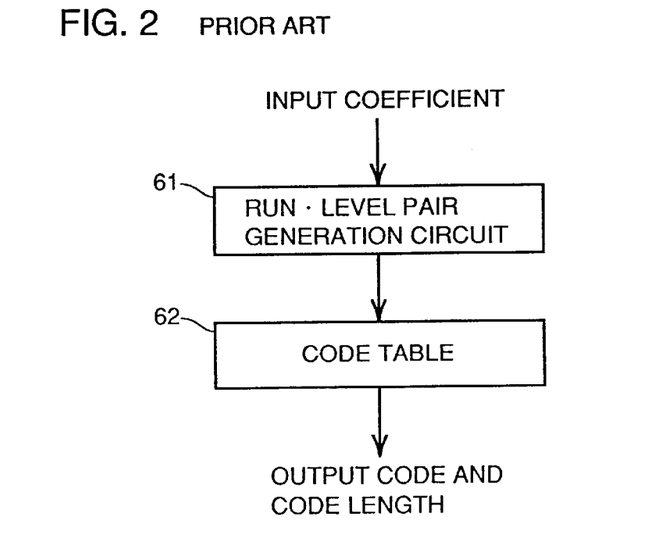
FIG. 2 is a block diagram of a conventional variable-length coding circuit.

FIG. 2 shows a conventional variable-length coding circuit. An input coefficient string is converted by a run.level pair generation circuit 61 to a pair of run data representing the number of successive 0 coefficients and level data representing a non-zero coefficient following 0. A correspondence table storing in advance a correspondence between a pair of run data and level data and a code and code length is referred to, for outputting a code and code length corresponding to the pair of run data and level data by a code table 62. Codes output from code table 62 have various code lengths, and the codes may be converted to have fixed length by a fixed length conversion circuit (not shown) in some cases.

In general, the variable-length coding circuit does not allocate a specific variable-length code to every pair of run data and level data. To a pair of run data and level data with low probability of occurrence, a fixed length code formed of a specific escape code as a leading one and run data and level data added thereto as they are is assigned, or the pair of run data and level data with low probability of occurrence is converted to two different pairs of run data and level data having specific codes allocated thereto as shown by equation (1).

$$(R,L) \rightarrow (R-1, 0) + (0,L) \quad (1)$$

In the equation above, R and L respectively represent run data and level data. Although the level data is essentially a non-zero coefficient, level data of 0 is defined by this conversion.

Figure 3:
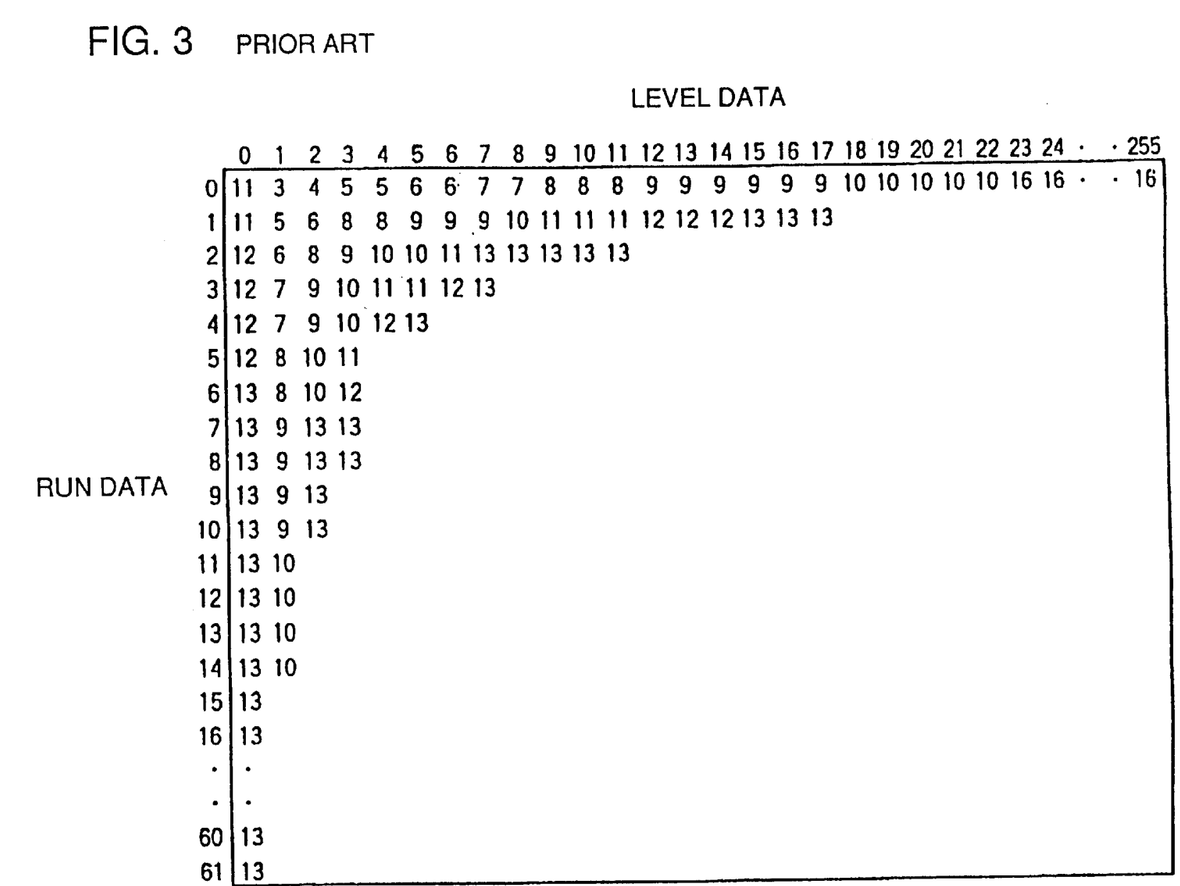
FIG. 3 shows how a code length is allocated to a pair of run data and level data by the conventional variable-length coding circuit.

An example of allocation of a code to a pair of run data and level data according to this system is shown in FIG. 3. Here, instead of the code itself, a code length is used for allocation. The level data are defined as 0-255 (absolute values), and run data are defined as 0-61. If the level data is not 0, one bit representing whether the level data is positive or negative is included in a code length. An empty portion in the table corresponds to a pair of run data and level data to which no code is allocated, and the pair is converted to a pair of run data and level data having a code allocated thereto by conversion following the equation (1). For example, no code is allocated to a pair of run data and level data respectively of 10 and 20, and the pair of run data and level data is converted to two pairs of 9 and 0, and 0 and 20 based on equation (1). With reference to FIG. 3, a short code is allocated to a pair of run data and level data with a high probability of occurrence, and a long code is allocated to a pair of run data and level data with a low probability of occurrence.

Figure 4:
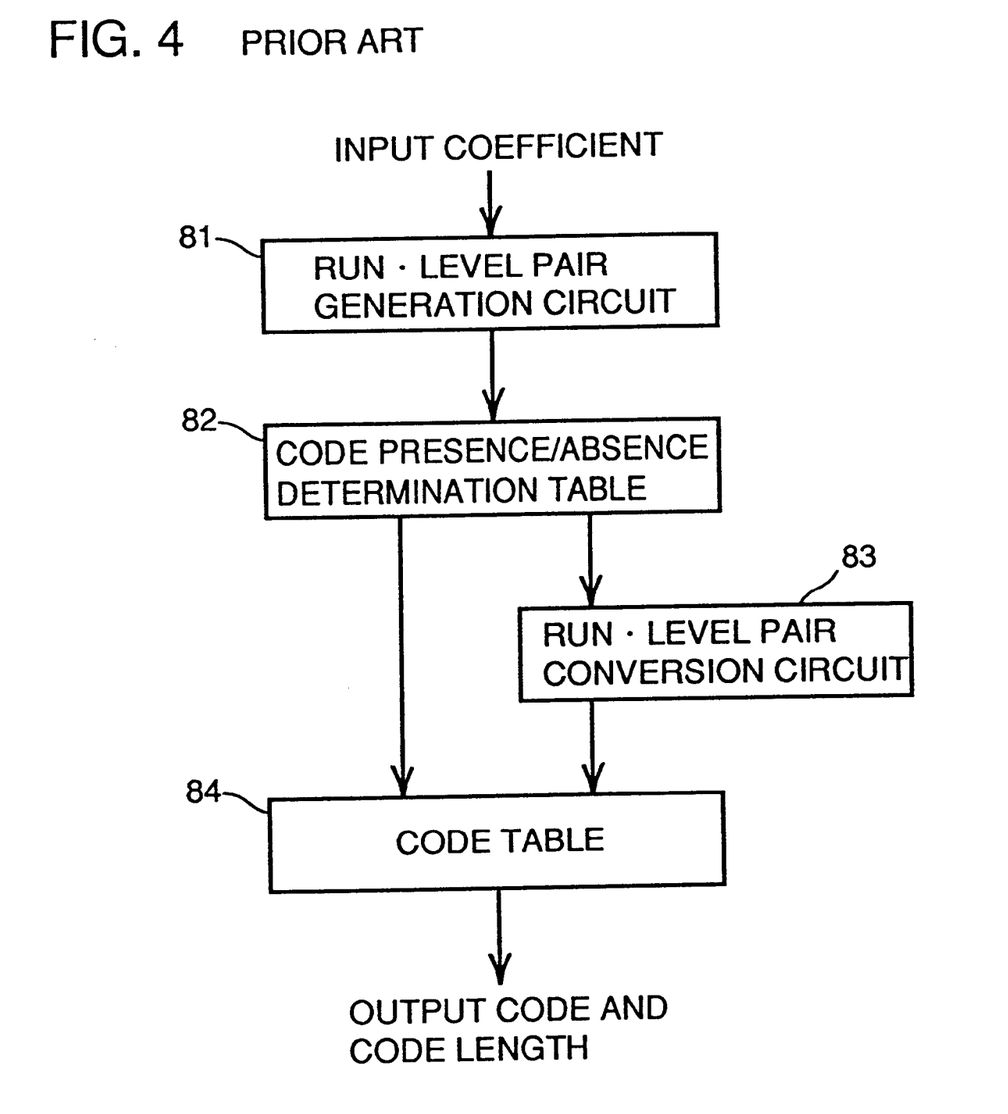
FIG. 4 is a block diagram of another conventional variable-length coding circuit.

FIG. 4 shows an example of a conventional variable-length coding circuit according to this system. An input coefficient string is converted by a run.level pair generation circuit 81 to a pair of run data representing the number of successive 0 coefficients and level data representing a non-zero coefficient following 0. Whether a code is allocated to a pair of run data and level data is determined by a code presence/absence determination table 82. If it is determined that a code is allocated to the pair of run data and level data, the pair is transferred to a code table 84, converted to a corresponding code and code length by reference to a correspondence table storing in advance a correspondence between a pair of run data and level data and a code and code length, and the converted one is output. If it is determined that no code is allocated to the pair, the pair is transferred to a run.level conversion circuit 83 and converted according to the equation (1). (The level data could be 0.) Consequently, two pairs of run data and level data are transferred to code table 84, and each of them is converted to a corresponding code and code length to be output.

Figure 5:
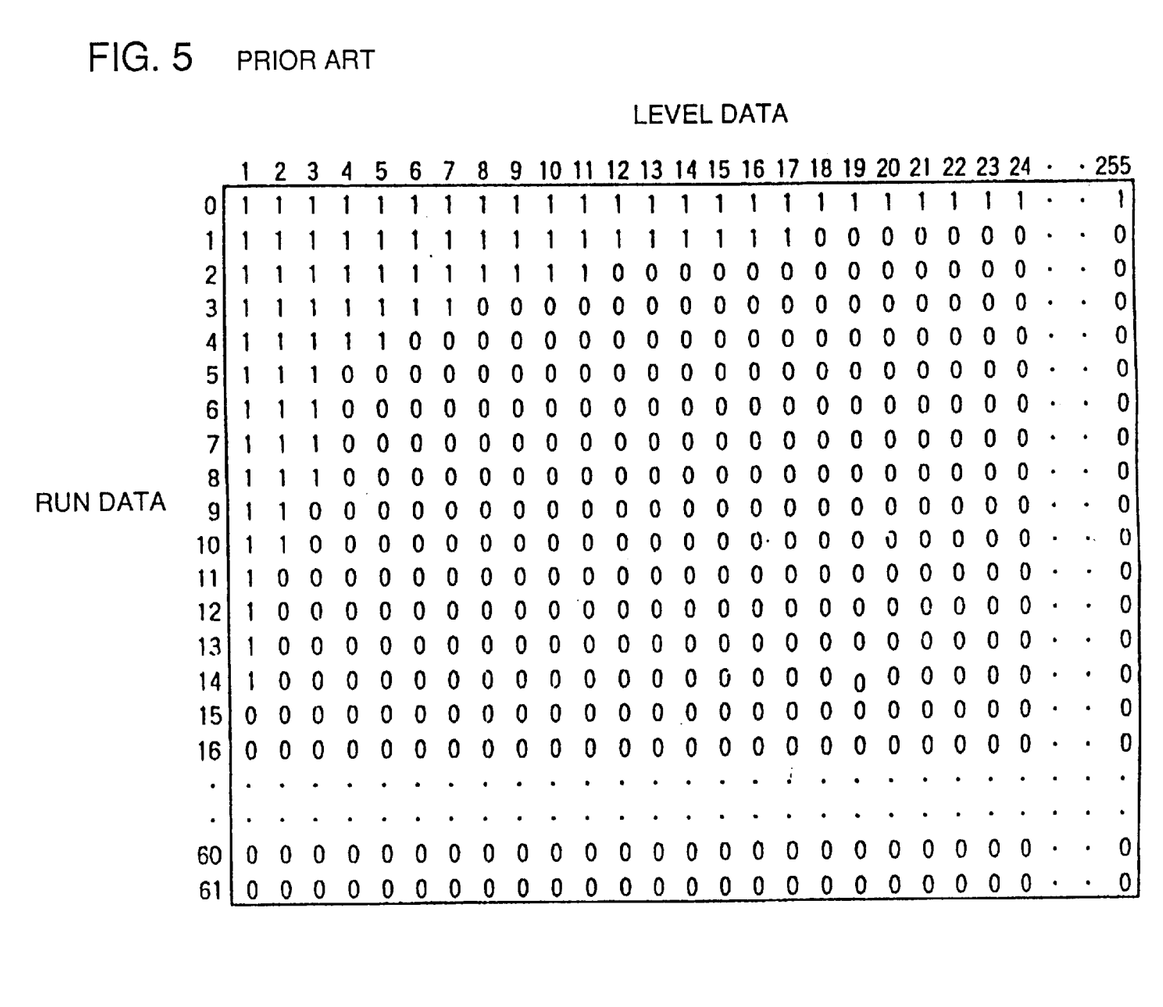
FIG. 5 shows contents of a code presence/absence determination table for the another conventional variable-length coding circuit.

Code presence/absence determination table 82 is structured as shown in FIG. 5 such that 1 representing allocation of a code corresponding to a pair of run data and level data or 0 representing that no code is allocated to a pair of run data and level data is stored in advance. In code table 84, a code and code length corresponding to a pair of run data and level data to which a code is allocated is stored as shown in FIG. 3.

A problem of the conventional variable length coding circuit described above is as follows.

With reference to FIG. 5, in order to be determined whether a code is allocated or not by code presence/absence determination table 82, an address of total 14 bits formed of 6 bits representing run data and 8 bits representing an absolute value of level data is necessary. The number of words is 255×62=15,810, and an output is 1 bit showing whether a code is allocated or not. Accordingly, a memory having a large capacity of total 15,810×1=15,810 bits is required. In addition, code presence/absence determination table 82 should be referred to correspondingly to all of the pairs of run data and level data generated by run.level pair generation circuit 81. The memory having a large capacity is highly frequently accessed and power consumption increases.

Referring to FIG. 3, when conversion to a code and code length is performed by code table 84, an address of total 15 bits, formed of 6 bits representing run data, 8 bits representing an absolute value of level data, and 1 bit representing whether the level data is positive or negative, is needed. The number of pairs of run data and level data which is 0 is 62, and the number of pairs of run data and level data which is not 0 is 315. As a result, the number of total words is 62+315×2=692. An output is total 20 bits comprised of 16 bits representing a code and 4 bits representing a code length, and a memory having a large capacity of total 692×20=13,840 bits is necessary. Further, code table 84 is referred to correspondingly to all of the pairs of run data and level data for which code presence/absence determination table 82 determines that codes are allocated respectively, and all of two pairs of run data and level data newly generated by run.level pair conversion circuit 83. Consequently, one access is made to a memory having a large capacity, and power consumption increases.

SUMMARY OF THE INVENTION

An object of the present invention is to provide a variable-length coding device by which a capacity of a table used for coding as well as power consumption can be decreased.

Another object of the invention is to provide a method of variable-length coding achieving reduction of a capacity of a table used for coding and reduction of power consumption.

According to an aspect of the invention, a variable-length coding device includes: a code presence/absence determination table storing information concerning whether a code is allocated or not correspondingly to a prescribed region in a region represented by a combination of run data and level data; first and second region determination circuits determining whether a pair of run data and level data is contained in the prescribed region; and a run.level pair conversion circuit, and first and second code tables that perform coding referring to the code presence/absence determination table if the first and second region determination circuits determine that the pair of run data and level data is contained in the prescribed region, and perform coding without referring to the code presence/absence determination table if the first and second region determination circuits determine that the pair of run data and level data is not contained in the prescribed region.

The capacity of the code presence/absence determination table can be decreased since only information corresponding to a prescribed region in the region represented by a combination of run data and level data is stored. Power consumption can be decreased since the code presence/absence determination table is not referred to if the first and second region determination circuits determine that a pair of run data and level data is not contained in the prescribed region.

According to another aspect of the invention, a variable-length coding device includes: a first region determination circuit determining that a region represented by run data of 0 is a first region in a region represented by a combination of run data and level data; a second region determination circuit determining that a region represented by run data that is not less than a first prescribed value and a region represented by run data that is not less than 1 and level data that is not less than a second prescribed value are second regions in the region represented by a combination of run data and level data; a code presence/absence determination table storing information concerning whether a code is allocated or not correspondingly to a region other than the first and second regions in the region represented by a combination of run data and level data; a run.level pair conversion circuit converting a pair of run data and level data to two pairs of run data and level data if the first and second region determination circuits determine that the pair of run data and level data corresponds to any region other than the first and second regions and it is determined that there is no code corresponding to the pair of run data and level data by the code presence/absence determination table, and if the second region determination circuit determines that the pair of run data and level data corresponds to the second region; a first code table outputting a code and a code length corresponding to a pair of run data and level data if the first region determination circuit determines that the pair of run data and level data corresponds to the first region, and if the pair of run data and level data is converted to two pairs of run data and level data by the run.level pair conversion circuit; and a second code table outputting a code and a code length corresponding to a pair of run data and level data if the code presence/absence determination table determines that a code corresponding to the pair of run data and level data is allocated.

The capacity of the code presence/absence determination table can be decreased since the table contains only information corresponding to a region other than the first and second regions in the region represented by a combination of run data and level data. Further, power consumption can be reduced since the code presence/absence determination table is not referred to if the first region determination circuit determines that a pair of run data and level data corresponds to the first region and if the second region determination circuit determines that the pair of run data and level data corresponds to the second region.

According to still another aspect of the invention, a method of variable-length coding includes a step of storing information concerning whether a code is allocated or not correspondingly to a prescribed region in a region represented by a combination of run data and level data, a step of determining whether a pair of run data and level data is contained in the prescribed region, and a step of coding referring to the stored information if it is determined that the pair of run data and level data is contained in the prescribed region, and coding without referring to the stored information if it is determined that the pair of run data and level data is not contained in the prescribed region.

The capacity of the table for storing information can be reduced since only information concerning a prescribed region in the region represented by a combination of run data and level data is stored. Further, power consumption can be decreased since the stored information is not referred to if it is determined that the pair of run data and level data is not contained in the prescribed region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
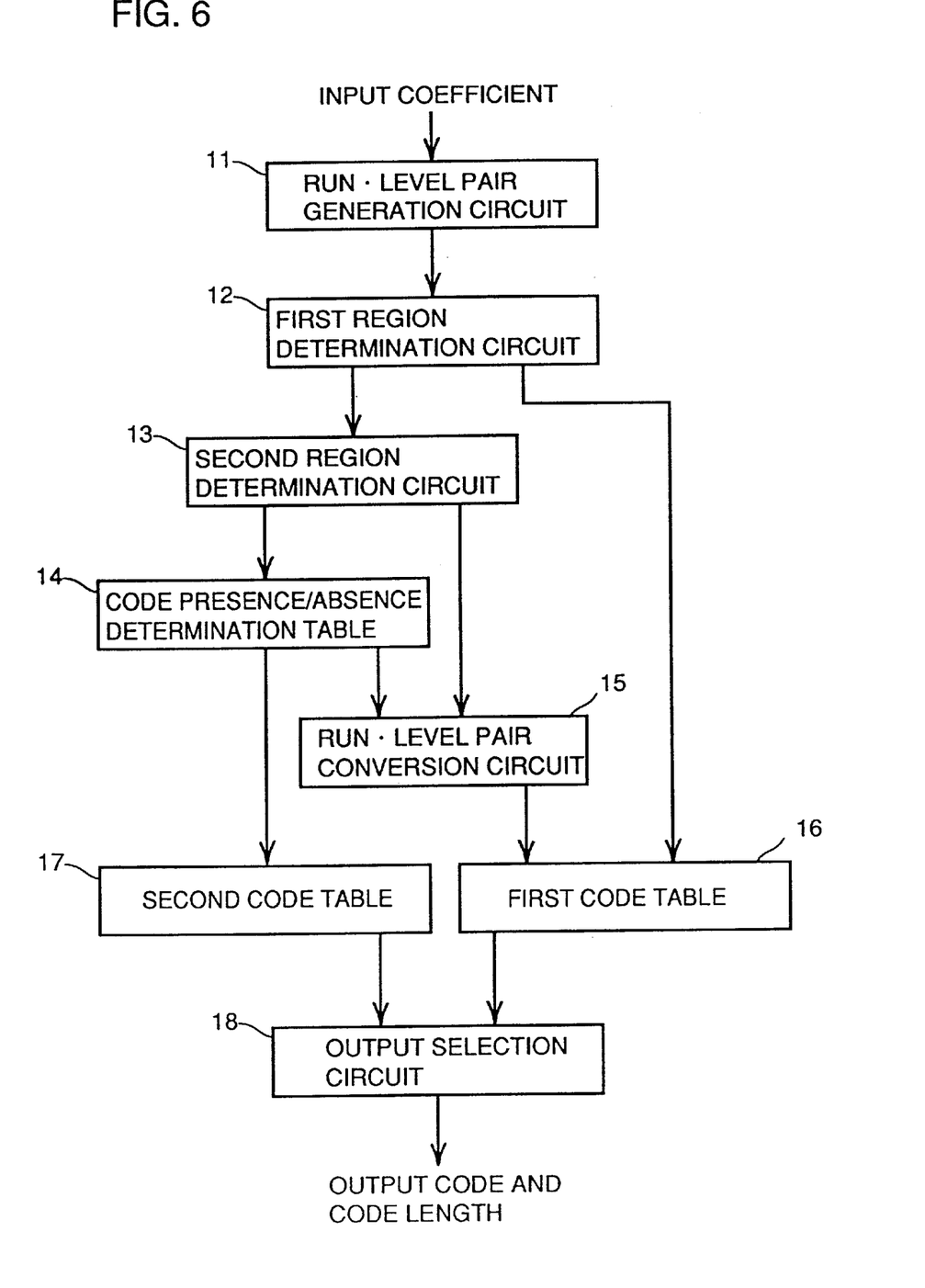
FIG. 6 is a block diagram of a variable-length coding device according to an embodiment of the invention.

Referring to FIG. 6, a variable-length coding device according to an embodiment of the present invention includes a run.level pair generation circuit 11 generating a pair of run data and level data from an input coefficient string, a first region determination circuit 12 determining whether or not the pair of run data and level data is contained in a first region in a region represented by a pair of run data and level data, a second region determination circuit 13 determining whether or not the pair of run data and level data is contained in a second region in the region represented by a pair of run data and level data, a code presence/absence determination table 14 storing information concerning whether a code corresponding to the pair of run data and level data is allocated or not, a run.level pair conversion circuit 15 converting a pair of run data and level data to two pairs of run data and level data, a first code table 16 and a second code table 17 storing a code and a code length corresponding to a pair of run data and level data, and an output selection circuit 18 selecting and outputting a code and a code length supplied from the first code table 16 and the second code table 17.

Run.level pair generation circuit 11 converts an input coefficient string to run data representing the number of successive 0 coefficients and level data representing a non-zero coefficient following 0, and transfers a pair of the run data and level data to the first region determination circuit 12. The first region determination circuit 12 determines whether the run data is 0 or not, and transfers the pair of run data and level data to the first code table 16 if the run data is 0, and transfers it to the second region determination circuit 13 if the run data is not 0. The second region determination circuit 13 determines whether the run data is 15 or more or the level data is 18 or more, and transfers the pair of run data and level data to run.level pair conversion circuit 15 if the run data is 15 or more or the level data is 18 or more, and transfers it to code presence/absence determination table 14 if the run data is less than 15 and the level data is less than 18.

Whether or not a code is allocated to the pair of run data and level data is determined by code presence/absence determination table 14. If a code is allocated to the pair of run data and level data, the pair is transferred to the second code tale 17, and if no code is allocated to the pair, the pair is transferred to run.level conversion circuit 15. By run.level conversion circuit 15, the pair of run data and level data is converted according to the equation (1), and resultant two pairs of run data and level data are transferred to the first code table 16. By the first code table 16 or the second code table 17, the pair(s) of run data and level data is (are) converted to a corresponding code and code length to be output referring to a correspondence table storing in advance a correspondence between a pair of run data and level data and a code and code length. Output selection circuit 18 selects and outputs a valid output from the first code table 16 or the second code table 17.

The variable-length coding device according to the embodiment is hereinafter described in detail.

Referring to FIG. 5, any code is allocated to a first region corresponding to run data of 0 in the conventional code presence/absence determination table 82. According to this embodiment, the first region determination circuit 12 determines that a pair of run data and level data contained in the first region has the run data of 0, and the pair is transferred to the first code table 16 skipping code presence/absence determination table 14. No code is allocated to a second region corresponding to run data of 15 or more, or run data other than 0 and level data of 18 or more in the conventional code presence/absence determination table 82 shown in FIG. 5. According to this embodiment, the second region determination circuit 13 determines that a pair of run data and level data contained in the second region is formed of the run data of 15 or more or the level data of 18 or more, and the pair is transferred to run.level pair conversion circuit 15 skipping code presence/absence determination table 14. The first code table 16 corresponds to a pair of run data and level data when either of run data and level data is 0, and the second code table 17 corresponds to a pair of run data and level data when neither of run data and level data is 0 in the conventional code table shown in FIG. 3.

The variable-length coding device is structured such that an operation of code presence/absence determination table 14 is stopped if the first region determination circuit 12 determines that a pair of run data and level data has the run data of 0, or the second region determination circuit 13 determines that run data is 15 or more or level data is 18 or more. If the first region determination circuit 12 determines that run data is 0, if the second region determination circuit 13 determines that run data is 15 or more or level data is 18 or more, or if it is determined that no code is allocated to the pair by code presence/absence determination table 14, the variable-length coding device is structured such that an operation of the second code table 17 is stopped. The device is further structured such that an operation of the first code table 16 is stopped if it is determined that a code is allocated to the pair by code presence/absence determination table 14. In order to stop an operation of each table, an input signal to the table may be fixed, or a select signal for a memory constituting the table may be rendered non-active.

Figure 7:
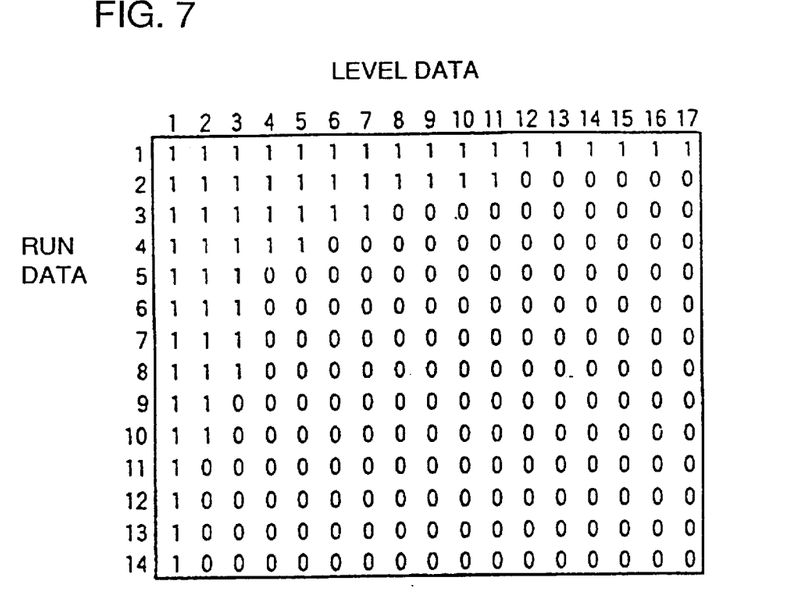
FIG. 7 shows contents of a code presence/absence determination table for the variable-length coding device according to the embodiment of the invention.

Code presence/absence determination table 14 is structured as shown in FIG. 7 in which 1 representing allocation of a code, and 0 representing no allocation of a code are stored in advance. If determination concerning allocation of a code is carried out by code presence/absence determination table 14, an address of total 9 bits is sufficient. Specifically, the address is formed of the lower order 4 bits of 6 bits representing run data, and the lower order of 5 bits of 8 bits representing an absolute value of level data. Consequently, the number of the bits of an address can be decreased compared with the conventional address of 14 bits, and a decoder circuit can be reduced in scale. Further, the number of words is 17×14=238, and an output is 1 bit representing whether there is a code or not. Therefore, the memory capacity of total 238×1=238 bits is sufficient. The memory capacity is at most 1/60 of the 15,810 bits necessary for the conventional memory.

The number of combinations of run data and level data can be 255×62=15,810. Code presence/absence determination table 14 is referred to only for pairs of run data and level data corresponding to combinations of 17×14=238, and the frequency of access to a memory is decreased.

The first region determination circuit 12 and the second region determination circuit 13 determine whether or not a code is allocated to a pair of run data and level data before referring to code presence/absence determination table 14, and reading of code presence/absence determination table 14 is stopped if there is no need to refer to code presence/absence determination table 14. As a result, the memory capacity of code presence/absence determination table 14 can be decreased, and the access frequency to the memory of code presence/absence determination table 14 can be decreased.

Figure 8A:
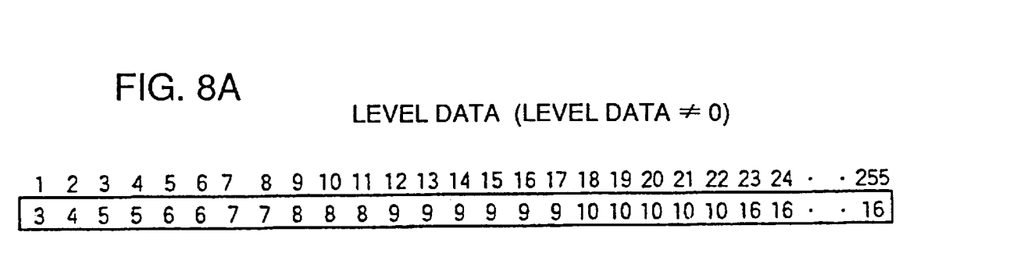
FIGS. 8A and 8B show contents of a first code table for the variable-length coding device according to the embodiment of the invention.
Figure 8B:
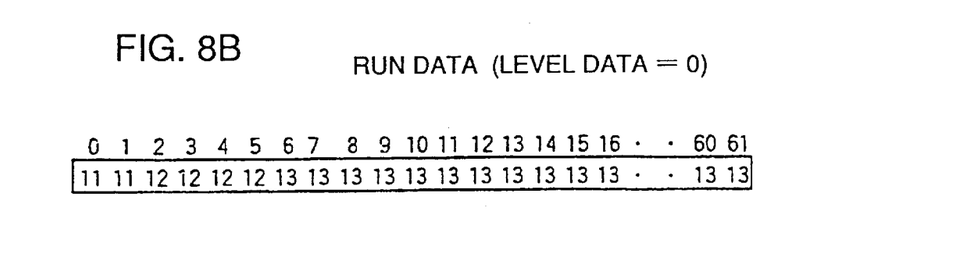

The first code table 16 is constituted of two memories as shown in FIGS. 8A and 8B. One memory corresponds to level data other than 0, and the other corresponds to level data of 0. A simple combinational circuit can determine whether level data is 0 or not. If level data is not 0, an address of total 9 bits is sufficient. Specifically, the address is constituted of 8 bits representing an absolute value of level data and 1 bit representing whether the level data is positive or negative. Accordingly, the number of bits of an address can be decreased compared with the address of 15 bits that is necessary for the conventional circuit, and a decoder circuit can be reduced in scale. Further, the number of words is 255×2=510, an output is total 20 bits constituted of 16 bits representing a code and 4 bits representing a code length, and the memory capacity is total 510×20=10,200 bits. If the level data is 0, an address of 6 bits representing run data is sufficient, allowing the number of bits of an address to be decreased compared with the conventional address of 15 bits, and a decoder circuit to be reduced in scale. The number of words is 62, and an output is total 17 bits constituted of 13 bits representing a code and 4 bits representing a code length, and a memory capacity is total 62×13=806 bits.

Figure 9:
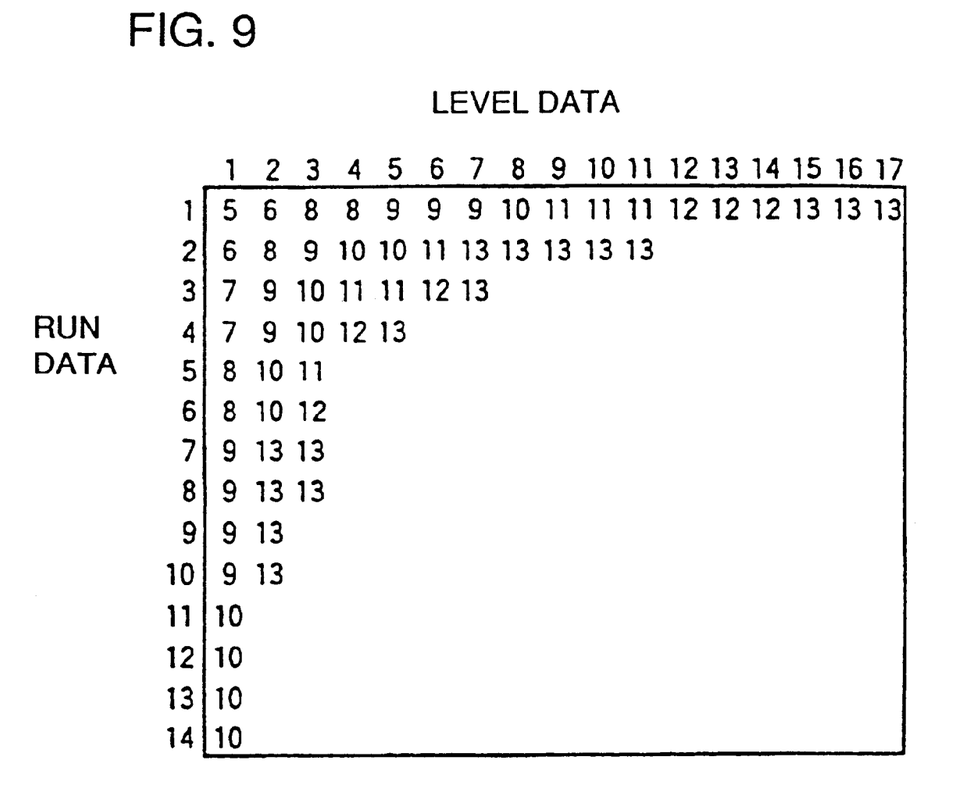
FIG. 9 shows contents of a second code table for the variable-length coding device according to the embodiment of the invention.

Consequently, the memory capacity of the first code table 16 is total 10,200+806=11,006 bits. Further, as shown in FIG. 9, an address for the second code table 17 is total 10 bits constituted of the lower order 4 bits of 6 bits representing run data, the lower order 5 bits of 8 bits representing an absolute value of level data, and 1 bit representing whether level data is positive or negative. Therefore, the number of bits of an address can be reduced compared with the conventional address of 15 bits, and a decoder circuit can be reduced in scale. The number of words is 60×2=120, an output is total 17 bits constituted of 13 bits representing a code and 4 bits representing a code length, and the memory capacity is total 120×17=2,040 bits. The code table of the memory capacity of 13,840 bits is always referred to by the conventional circuit. According to this embodiment, the first code table 16 having the memory capacity of 11,006 bits is referred to only if the first region determination circuit 12 determines that run data is 0, if the second region determination circuit 13 determines that run data is 15 or more or level data is 18 or more, or if it is determined that no code is allocated by code presence/absence determination table 14. The second code table 17 having the memory capacity of 2,040 bits is referred to only if it is determined that a code is allocated by code presence/absence determination table 14. As a result, the capacity of a memory of a code table to which an access is made at a time is decreased.

As described above, the code table is divided into the first code table 16 corresponding to a pair of run data and level data when either of run data and level data is 0, and the second code table 17 corresponding to a pair of run data and level data when neither of the run data and level data is 0. Further, the first region determination circuit 12, the second region determination circuit 13, and code presence/absence determination table 14 are provided that determine which of the code tables should be referred to when a pair of run data and level data is to be coded, and reading of one of the code tables to which reference is unnecessary is stopped, so that the capacity of a memory of a code table to which an access is made at a time can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable-length coding device comprising:

storing means for storing information concerning whether a code is allocated or not correspondingly to a prescribed region in a region represented by a combination of run data and level data;

determination means for determining whether a pair of run data and level data is contained in said prescribed region; and coding means for coding, referring to said storing means, if said determination means determines that said pair of run data and level data is contained in said prescribed region, and coding without referring to said storing means if said determination means determines that said pair of run data and level data is not contained in said prescribed region.

2. The variable-length coding device according to claim 1, wherein said coding means stops an operation of said storing means when said storing means is not referred to.

3. The variable-length coding device according to claim 1, wherein said determination means includes:

a first region determination means for determining that a region corresponding to run data of 0 in said region represented by a combination of run data and level data is a first region;

a second region determination means for determining that a region corresponding to run data that is not less than a first prescribed value, and a region corresponding to run data that is not less than 1 and level data that is not less than a second prescribed value are second regions in said region represented by a combination of run data and level data; and prescribed region determination means for determining that a region other than the first region determined by said first region determination means and other than the second regions determined by said second region determination means is said prescribed region in said region represented by a combination of run data and level data.

4. The variable-length coding device according to claim 3, wherein said coding means includes:

a first code table storing a code and a code length corresponding to the first region determined by said first region determination means and corresponding to a combination of run data and level data which is 0;

a second code table storing a code and a code length of a pair of run data and level data corresponding to information showing that a code is allocated, among information stored in said storing means;

conversion means for converting a pair of run data and level data to two pairs of run data and level data; and code generation means for
coding by referring to said second code table if it is determined that the pair of run data and level data is in said prescribed region by said prescribed region determination means and it is determined by referring to said storing means that a code corresponding to the pair of run data and level data is allocated, and for generating and outputting a code based on the two pairs of run data and level data converted by said conversion means and based on a code and a code length stored in said first code table, if it is determined that the pair of run data and level data is in said prescribed region by said prescribed region determination means and it is determined by referring to said storing means that no code corresponding to the pair of run data and level data is allocated, and if it is determined that the pair of run data and level data is in said second region by said second region determination means.

5. The variable-length coding device according to claim 4, wherein
said code generation means stops an operation of said second code table when said first code table is referred to, and stops an operation of said first code table when said second code table is referred to.

6. A variable-length coding device comprising:
a first region determination circuit determining that a region corresponding to run data of 0 in a region represented by a combination of run data and level data is a first region;

a second region determination circuit determining that a region corresponding to run data that is not less than a first prescribed value and a region corresponding to run data that is not less than 1 and level data is not less than a second prescribed value in said region represented by a combination of run data and level data are second regions;

a code presence/absence determination table storing information concerning whether a code is allocated or not correspondingly to a region other than said first and second regions in said region represented by a combination of run data and level data;

a run.level pair conversion circuit converting a pair of run data and level data to two pairs of run data and level data, if said first region determination circuit and said second region determination circuit determine that said pair of run data and level data does not correspond to said first and second regions and it is determined that there is no code corresponding to said pair of run data and level data by said code presence/absence determination table, and if said second region determination circuit determines that said pair of run data and level data corresponds to said second region;

a first code table outputting a code and a code length corresponding to said pair of run data and level data if said first region determination circuit determines that said pair of run data and level data corresponds to said first region, and if said run.level pair conversion circuit converts said pair of run data and level data to two pairs of run data and level data; and a second code table outputting a code and a code length corresponding to said pair of run data and level data if it is determined by said code presence/absence determination table that a code corresponding to said pair of run data and level data is allocated.

7. A method of variable-length coding comprising the steps of:
storing information concerning whether a code is allocated or not correspondingly to a prescribed region in a region represented by a combination of run data and level data;

determining whether a pair of run data and level data is contained in said prescribed region;

coding, referring to said stored information, if it is determined that said pair of run data and level data is contained in said prescribed region, and coding without referring to said stored information if it is determined that said pair of run data and level data is not contained in said prescribed region.

8. The method of variable-length coding according to claim 7, wherein
said step of determining whether a pair of run data and level data is contained in said prescribed region includes the steps of:
determining that a region corresponding to run data of 0 in said region represented by said combination of run data and level data is a first region;

determining that a region corresponding to run data that is not less than a first prescribed value and a region corresponding to run data that is not less than 1 and level data that is not less than a second prescribed value are second regions in said region represented by said combination of run data and level data; and determining that a region other than said first and second regions in said region represented by said combination of run data and level data is said prescribed region.

9. The method of variable-length coding according to claim 8, wherein
said step of coding includes the steps of:
coding by using a second code table storing a code and a code length corresponding to said pair of run data and level data, if it is determined that said pair of run data and level data is in said prescribed region and it is determined by referring to said stored information that a code corresponding to said pair of run data and level data is allocated; and converting said pair of run data and level data to two pairs of run data and level data, and coding by using a first code table storing a code and a code length corresponding to said two pairs of run data and level data, if it is determined that said pair of run data and level data is in said prescribed region and it is determined by referring to said stored information that no code corresponding to said pair of run data and level data is allocated, and if it is determined that said pair of run data and level data is in said second region.

* * * * *